(12) United States Patent
Stolitzka (10) Patent No.: US 10,432,353 B2
(45) Date of Patent: *Oct. 1, 2019

(54) MEMORY-EFFICIENT METHODS OF TRANSPORTING ERROR CORRECTION CODES IN A SYMBOL ENCODED TRANSMISSION STREAM

(71) Applicant: SAMSUNG DISPLAY CO., LTD., Yongin-si, Gyeonggi-Do (KR)

(72) Inventor: Dale F. Stolitzka, Los Altos, CA (US)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 14/952,797

(22) Filed: Nov. 25, 2015

(65) Prior Publication Data

US 2016/0164631 A1 Jun. 9, 2016

Related U.S. Application Data

(60) Provisional application No. 62/087,772, filed on Dec. 4, 2014.

(51) Int. Cl.
*H04L 1/00* (2006.01)
*H03M 13/19* (2006.01)
(Continued)

(52) U.S. Cl.
CPC ...... *H04L 1/0043* (2013.01); *H03M 13/2906* (2013.01); *H03M 13/51* (2013.01);
(Continued)

(58) Field of Classification Search
CPC ... H04L 1/0043; H04L 1/0041; H04L 1/0057; H04L 1/0064; H04L 1/0045;
(Continued)

(56) References Cited

U.S. PATENT DOCUMENTS 6,182,264 B1 * 1/2001 Ott .................. H03M 13/15
714/774
6,505,320 B1 * 1/2003 Turk ................ G11B 20/10055
341/59

(Continued)

FOREIGN PATENT DOCUMENTS

CN 101714971 A 5/2010
CN 101729194 A 6/2010
(Continued)

OTHER PUBLICATIONS

U.S. Office Action dated Dec. 1, 2016, issued in cross-referenced U.S. Appl. No. 14/723,075 (63 pages).
(Continued)

*Primary Examiner* — Guy J Lamarre
(74) *Attorney, Agent, or Firm* — Lewis Roca Rothgerber Christie LLP (57) ABSTRACT

There is provided a method of transporting error correction codes (ECCs) in a transmission stream, the method including encoding a data stream from a data source into data symbols, generating first ECCs from the data symbols, encoding the first ECCs into first error correction code (ECC) symbols, merging the data symbols and the first ECC symbols into the transmission stream, the first ECC symbols being merged before the data symbols into the transmission stream, and transmitting the merged transmission stream to a sink device via a communication link, the first ECC symbols being transmitted before the data symbols.

16 Claims, 9 Drawing Sheets

(51) Int. Cl.
*H03M 13/29* (2006.01)
*H03M 13/51* (2006.01)
*H03M 13/00* (2006.01)

(52) U.S. Cl.
CPC .......... *H04L 1/0041* (2013.01); *H04L 1/0045* (2013.01); *H04L 1/0057* (2013.01); *H04L 1/0064* (2013.01); *H03M 13/19* (2013.01)

(58) Field of Classification Search
CPC .. H03M 13/2906; H03M 13/51; H03M 13/19; H03M 13/13; H03M 13/00; H03M 13/15
See application file for complete search history.

(56) References Cited

U.S. PATENT DOCUMENTS

| | | | |
|---|---|---|---|
| 6,621,982 | B1 | 9/2003 | Kimura et al. |
| 6,662,334 | B1 | 12/2003 | Stenfort |
| 7,555,695 | B2 | 6/2009 | Oogami et al. |
| 8,279,755 | B2 | 10/2012 | Luby |
| 8,332,721 | B2* | 12/2012 | Lawson ................ H04L 1/0061 714/758 |
| 2001/0053225 | A1 | 12/2001 | Ohira et al. |
| 2002/0199153 | A1* | 12/2002 | Fall ...................... H03M 13/00 714/781 |
| 2004/0044835 | A1 | 3/2004 | Gongwer et al. |
| 2005/0138522 | A1 | 6/2005 | Silvus |
| 2006/0195752 | A1* | 8/2006 | Walker ................ H04L 1/0045 714/748 |
| 2008/0028279 | A1 | 1/2008 | Ver Steeg |
| 2008/0098282 | A1 | 4/2008 | Chien |
| 2008/0282130 | A1 | 11/2008 | Lee et al. |
| 2009/0019306 | A1* | 1/2009 | Hum ................... G06F 11/1064 714/2 |
| 2009/0193314 | A1 | 7/2009 | Melliar-Smith et al. |
| 2010/0050057 | A1 | 2/2010 | Luby |
| 2011/0141898 | A1 | 6/2011 | Nishioka |
| 2012/0117442 | A1 | 5/2012 | Lee |
| 2013/0308540 | A1 | 11/2013 | Abe et al. |
| 2014/0344650 | A1 | 11/2014 | Au |

FOREIGN PATENT DOCUMENTS

| | | |
|---|---|---|
| CN | 103152126 A | 6/2013 |
| KR | 10-0903513 B1 | 6/2009 |
| KR | 10-2012-0004662 | 1/2012 |
| KR | 10-1341933 B1 | 12/2013 |
| TW | 586273 B | 5/2004 |
| WO | WO 01/67447 A2 | 9/2001 |

OTHER PUBLICATIONS

Extended European Search Report for Application No. 15198105.7 dated May 9, 2016, 11 pages.
Korean Patent Abstracts for Korean Publication 10-2004-0004672 dated Jan. 13, 2004, corresponding to Korean Patent 10-0903513 dated Jun. 19, 2009, listed above, (1 page).
Korean Patent Abstracts for Korean Publication 10-2009-0101240 dated Sep. 24, 2009, corresponding to Korean Patent 10-1341933 dated Dec. 16, 2013, listed above, (1 page).
U.S. Office Action dated Jun. 8, 2017, issued in cross-reference U.S. Appl. No. 14/723,075 (60 pages).
U.S. Office Action dated Nov. 16, 2017, issued in U.S. Appl. No. 14/723,075 (69 pages).

\* cited by examiner

MEMORY-EFFICIENT METHODS OF TRANSPORTING ERROR CORRECTION CODES IN A SYMBOL ENCODED TRANSMISSION STREAM

CROSS-REFERENCE TO RELATED APPLICATION(S)

This application claims priority to and the benefit of U.S. Provisional Application No. 62/087,772, filed on Dec. 4, 2014, the entire content of which is incorporated herein by reference.

This application is also related to U.S. patent application Ser. No. 14/723,075, filed on May 27, 2015, the entire content of which is incorporated herein by reference.

BACKGROUND

1. Field

Aspects of embodiments of the present invention relate to methods of transporting error correction codes in a symbol encoded transmission stream.

2. Description of Related Art

High-speed data transmission may be implemented using a serial data link (e.g., one bit at a time, such as with a fiber optic cable link). A data stream may be composed of a number of bit groups (e.g., 8-bit groups) in serialized order ("bytes"). DC balancing, such as with 8 b/10 b encoding, may be used to encode the data stream ("data bytes") before transmitting (for example, 8-bit bytes may be converted to 10-bit symbols) so that the number of 0-bits (i.e., bits representing a binary value of '0') being transmitted equals (or substantially equals, such as being no more than one or two off from) the number of 1-bits (i.e., bits representing a binary value of '1') being transmitted, and with no single burst of either 0-bits or 1-bits (e.g., no more than five consecutive 0-bits or 1-bits). The encoded data stream is then decoded on the receiving side, such as with a corresponding 10 b/8 b decoding, to recover the original data stream. These techniques may help, for example, with DC balancing, clock recovery, and phase recovery, such as helping receiving devices determine the transmission rate of the transmitted encoded data.

Forward error correction (FEC) codes, such as hamming codes, reed-Solomon codes, or low-density parity-check (LDPC) codes, may be used in data transmissions to improve reliability of the communication by providing redundant bits or bytes ("parity bits" or "parity bytes") for error checking and error correction. These parity bits or bytes accompany the data transmission (data bits or bytes) and allow the receiver to verify that the correct data was sent and may even allow the receiver the ability to correct a limited number of errors in the transmission. Hamming codes are relatively straightforward and efficient, but correct only a limited number of errors (e.g., a few bits). Reed-solomon and LDPC codes are more computationally intensive than hamming codes, but provide for significantly more errors to be detected or corrected (e.g., entire bytes).

Forward error correction may also be combined with DC balancing. For example, parity bits or bytes may be generated for a data stream (data bytes) for forward error correction, and the data plus parity bits or bytes encoded through DC balancing into symbols before being transmitted. The receiver then decodes the symbols and performs the error detection and correction using the decoded parity bits or bytes on the decoded data bits or bytes. However, this introduces a problem with errors introduced during the data transmission. For example, a corrupted symbol may be mapped to an invalid symbol or to a valid symbol representing a different byte, thus causing something as small as a one-bit error in transmission to result in multiple bit errors (e.g., an entire byte, which may include 8 separate bit errors) in the received data and parity. This may present problems for low-cost FEC algorithms such as hamming codes, or force the use of a more complex FEC algorithm (such as reed-solomon or LDPC) to provide the capability to recover from one or more byte errors, versus only a few bit errors, which increases encoder and decoder complexity.

The above information disclosed in this Background section is only for enhancement of understanding of the background of the invention and therefore it may contain information that does not form the prior art that is already known to a person of ordinary skill in the art.

SUMMARY

Aspects of embodiments of the present invention are directed to a memory-efficient method of transporting error correction codes (ECCs) in a symbol encoded transmission stream.

Aspects of embodiments of the present invention are directed to a method of placing a forward error code (FEC) algorithm function after encoding the data stream into symbols and before decoding the data stream from symbols, and inserting an error correction code (ECC) generated by the FEC algorithm into the main data stream. Even further embodiments of the present invention are directed to creating an ECC of an encoded transmission stream, transporting the ECCs ahead of the encoded transmission stream, extracting and buffering the ECCs, and using the ECCs to correct bit errors in the transmission stream as it is received, prior to decoding (hereinafter referred to as "symbol-based error correction"). By transmitting the ECCs before the encoded transmission stream, while performing error correction, the buffer at the receiver may only store the ECCs, and not the transmission stream. This reduces the size of the buffer memory at the receiver and, as a result, reduces the size and complexity of the receiver, and reduces the overall system cost.

Additional embodiments are directed to reducing cost and latency of correcting a high-speed transmission stream. By way of example, some embodiments are directed to reducing cost by enabling a simple FEC algorithm (such as a hamming code with one- or two-bit error correction or detection) to correct an encoded transmission stream. As such, more complex FEC algorithms, such as reed-Solomon or LDPC, may be avoided, which may reduce the complexity (e.g., logic gate count) of an equivalent encoding/decoding solution by an order of magnitude. This may also enable high latency solutions, such as horizontal and vertical parity checking (and its associated large amount of packet buffering), to be avoided.

According to some exemplary embodiments of the present invention, there is provided a method of transporting error correction codes (ECCs) in a transmission stream, the method including: encoding, by a processor, a data stream from a data source into data symbols; generating, by the processor, first ECCs from the data symbols; encoding, by the processor, the first ECCs into first error correction code (ECC) symbols; merging, by the processor, the data symbols and the first ECC symbols into the transmission stream, the first ECC symbols being merged before the data symbols into the transmission stream; and transmitting, by the processor, the merged transmission stream to a sink device via a communication link, the first ECC symbols being transmitted before the data symbols.

In an embodiment, the encoding of the data stream into the data symbols and the encoding of the first ECCs into the first ECC symbols include a same encoding technique.

In an embodiment, the method further includes: generating, by the processor, second ECCs from the first ECCs; and encoding, by the processor, the second ECCs into second ECC symbols, wherein the merging of the data symbols and the first ECC symbols includes merging, by the processor, the second ECC symbols into the transmission stream.

In an embodiment, the encoding the first ECCs includes inserting, by the processor, a first control symbol before the first ECC symbols and inserting a second control symbol between the first ECC symbols and the data symbols into the transmission stream.

In an embodiment, the transmitting of the merged transmission stream includes: serializing, by the processor, the merged transmission stream; and transmitting, by the processor, the serialized transmission stream over a serial data link to the sink device.

In an embodiment, the method further includes buffering, by the processor, the data symbol in a data stream buffer.

According to some exemplary embodiments of the present invention, there is provided a method for extracting a data stream from a transmission stream including transport error correction codes (ECCs), the method including: receiving, by a processor of a sink device, the transmission stream from a source device via a communication link; extracting, by the processor, error correction code (ECC) symbols from the received transmission stream; decoding, by the processor, the ECC symbols into first ECCs; buffering, by the processor, the first ECCs; extracting, by the processor, data symbols from the transmission stream; correcting, by the processor, errors in the data symbols with the buffered first ECCs; and decoding, by the processor, the corrected data symbols into a data stream for outputting by the sink device.

In an embodiment, the decoding of the first ECC symbols into the first ECCs and the decoding of the corrected data symbols into the data stream include a same decoding technique.

In an embodiment, the decoding the first ECC symbols includes: decoding, by the processor, the ECC symbols into second ECCs; and correcting, by the processor, errors in the first ECCs with the second ECCs, and buffering the first ECCs includes buffering, by the processor, the corrected first ECCs, and the correcting of the errors in the data symbols includes correcting, by the processor, the errors in the data symbols with the buffered corrected first ECCs.

In an embodiment, the extracting of the ECC symbols includes identifying, by the processor, a control symbol between first ECC symbols and the data symbols and from the transmission stream.

In an embodiment, the receiving of the transmission stream includes: receiving, by the processor, the transmission stream from the source device over a serial data link; and de-serializing, by the processor, the received transmission stream.

According to some exemplary embodiments of the present invention, there is provided a method of transporting error correction codes (ECCs) in a transmission stream, the method including: encoding, by a first processor of a source device, a data stream from a data source into first data symbols; generating, by the first processor, ECCs from the first data symbols; buffering, by the first processor, the ECCs at the source device until a criteria has been met; merging, by the first processor, the first data symbols and the buffered ECCs into the transmission stream, the buffered ECCs being merged before the first data symbols into the transmission stream; transmitting, by the first processor, the merged transmission stream to a sink device via a communication link, the buffered ECCs being transmitted before the first data symbols; receiving, by a second processor of the sink device, a received transmission stream from the source device; extracting, by the second processor, the ECCs from the received transmission stream; buffering, by the second processor, the ECCs at the sink device; extracting, by the second processor, second data symbols from the received transmission stream; correcting, by the second processor, errors in the second data symbols with the buffered ECCs at the sink device; and decoding, by the second processor, the corrected second data symbols into a corrected data stream for outputting by the sink device.

In an embodiment, the merging of the first data symbols and the buffered ECCs includes: framing, by the first processor, the buffered ECCs at the source device with control symbols; and merging, by the first processor, the first data symbols and the framed ECCs into the transmission stream.

In an embodiment, framing the buffered ECCs includes inserting, by the first processor, a first control symbol of the control symbols before the buffered ECCs and a second control symbol of the control symbols after the buffered ECCs into the transmission stream.

In an embodiment, the transmitting of the merged transmission stream includes: serializing, by the first processor, the merged transmission stream; and transmitting, by the first processor, the serialized transmission stream over a serial data link to the sink device.

In an embodiment, the method of claim 12, further includes buffering, by the first processor, the first data symbols in a data stream buffer.

In an embodiment, the criteria includes one or more of the ECCs reaching a preset length, the ECCs not being in sufficient DC balance, and a number of transitions in the ECCs being below a preset value.

In an embodiment, extracting the ECCs from the received transmission stream includes: extracting, by the second processor, framed ECCs from the received transmission stream; and deframing, by the second processor, the framed ECCs into the ECCs by identifying and removing a first control symbol before the framed ECCs and a second control symbol after the framed ECCs.

According to some exemplary embodiments of the present invention, there is provided a method of transporting error correction codes (ECCs) in a transmission stream, the method including: encoding, by a symbol encoder, a data stream from a data source into data symbols; generating, by an error correction code (ECC) encoder, first ECCs from the data symbols; encoding, by the symbol encoder, the first ECCs into first error correction code (ECC) symbols; merging, by a multiplexer, the data symbols and the first ECC symbols into the transmission stream, the first ECC symbols being merged before the data symbols into the transmission stream; and transmitting, by a transmitter, the merged transmission stream to a sink device via a communication link, the first ECC symbols being transmitted before the data symbols.

According to some exemplary embodiments of the present invention, there is provided a method for extracting a data stream from a transmission stream including transport error correction codes (ECCs), the method including: receiving, by a receiver, the transmission stream from a source device via a communication link; extracting, by a processor, error correction code (ECC) symbols from the received transmission stream; decoding, by a symbol decoder, the ECC symbols into first ECCs; buffering, by a buffer memory, the first ECCs; extracting, by the processor, data symbols from the transmission stream; correcting, by an ECC decoder, errors in the data symbols with the buffered first ECCs; and decoding, by the symbol decoder, the corrected data symbols into a data stream for outputting by the sink device.

Accordingly, embodiments of the present invention provide for methods of transporting error correction codes (ECCs) in a symbol encoded transmission stream, and apparatuses using the same, which substantially reduce the memory requirements, size, complexity, and cost of the data transmission sink device (receiver), reduce the complexity and cost of the source device (transmitter), and result in a data stream recoverable with reduced or minimal latency.

BRIEF DESCRIPTION OF THE DRAWINGS

The accompanying drawings, together with the specification, illustrate exemplary embodiments of the present invention. These drawings, together with the description thereof, serve to better explain aspects and principles of the present invention.

DETAILED DESCRIPTION

Example embodiments of the present invention will now be described with reference to the accompanying drawings. In the drawings, the same or similar reference numerals refer to the same or similar elements throughout.

The encoders, decoders, and/or any other relevant devices or components according to embodiments of the present invention described herein may be implemented utilizing any suitable hardware, firmware (e.g., an application-specific integrated circuit), software, or a suitable combination of software, firmware, and hardware. For example, the various components of the encoders and decoders may be formed on one integrated circuit (IC) chip or on separate IC chips. Further, the various components of the encoders or decoders may be implemented on a flexible printed circuit film, a tape carrier package (TCP), a printed circuit board (PCB), or formed on a same substrate as the encoders or decoders.

Further, the various components of the encoders and decoders may be a process or thread, running on one or more processors, in one or more computing devices, executing computer program instructions and interacting with other system components for performing the various functionalities described herein. The computer program instructions are stored in a memory, which may be implemented in a computing device using a standard memory device, such as, for example, a random access memory (RAM). The computer program instructions may also be stored in other non-transitory computer readable media such as, for example, a CD-ROM, flash drive, or the like. In addition, a person of skill in the art should recognize that the functionality of various computing devices may be combined or integrated into a single computing device, or the functionality of a particular computing device may be distributed across one or more other computing devices without departing from the scope of the present invention.

Aspects of the present invention may be applied to any encoded stream, such as from a source to a display (e.g., using a DisplayPort interface), between two connected devices (e.g., one with a source and one with a sink), etc.

Figure 1:
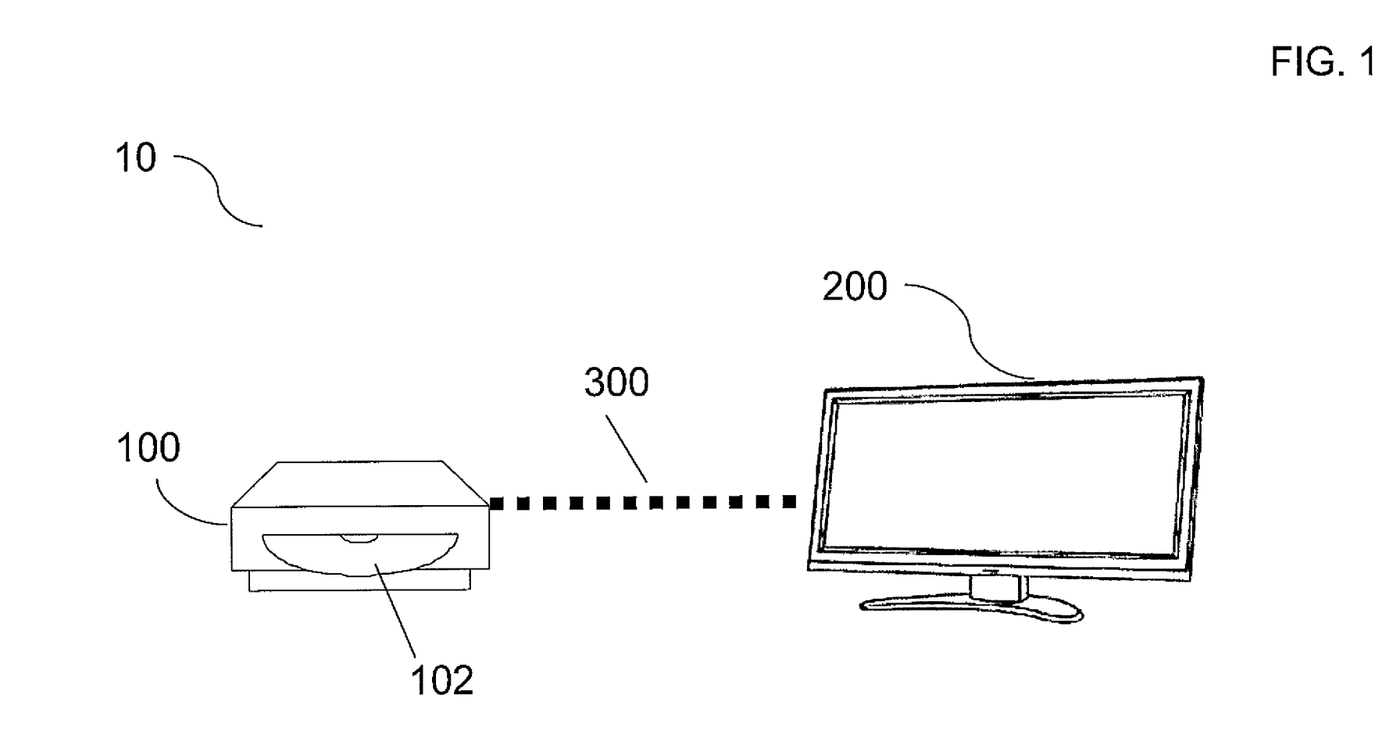
FIG. 1 is a schematic diagram illustrating a system for transporting ECC codes in a symbol encoded transmission stream according to some exemplary embodiments of the present invention.

FIG. 1 is a schematic diagram illustrating a system 10 for transporting ECC codes in a symbol encoded transmission stream according to some exemplary embodiments of the present invention.

The system 10 includes a source device 100 (e.g., a DVD drive) including or connected to a data source (e.g., CD, DVD, Blu-ray, hard-drive, mobile phone, or other data source) 102, a receiving (or sink) device 200 (e.g., a display device or other device having a data sink, which may include circuitry for driving a display panel), and a communication link 300 (e.g., a wire, a high speed serial data link, such as coaxial cable, Ethernet cable, or the like) for transmitting data between the source device 100 and the sink device 200. The source device 20 and the sink device 200 may each contain a processor (e.g., a microprocessor and memory, hardwired circuits, programmable logic arrays, etc.) for performing the methods described herein as well as those derivable from the present application, as would be apparent to one of ordinary skill. The system 10 may be utilized to implement any real-time communication system in which data is embedded in symbols and requires data correction. For example, the system 10 may be utilized to facilitate communication between a set top box and a TV, between a mobile phone or notebook and a display device, between servers, and the like.

Figure 2:
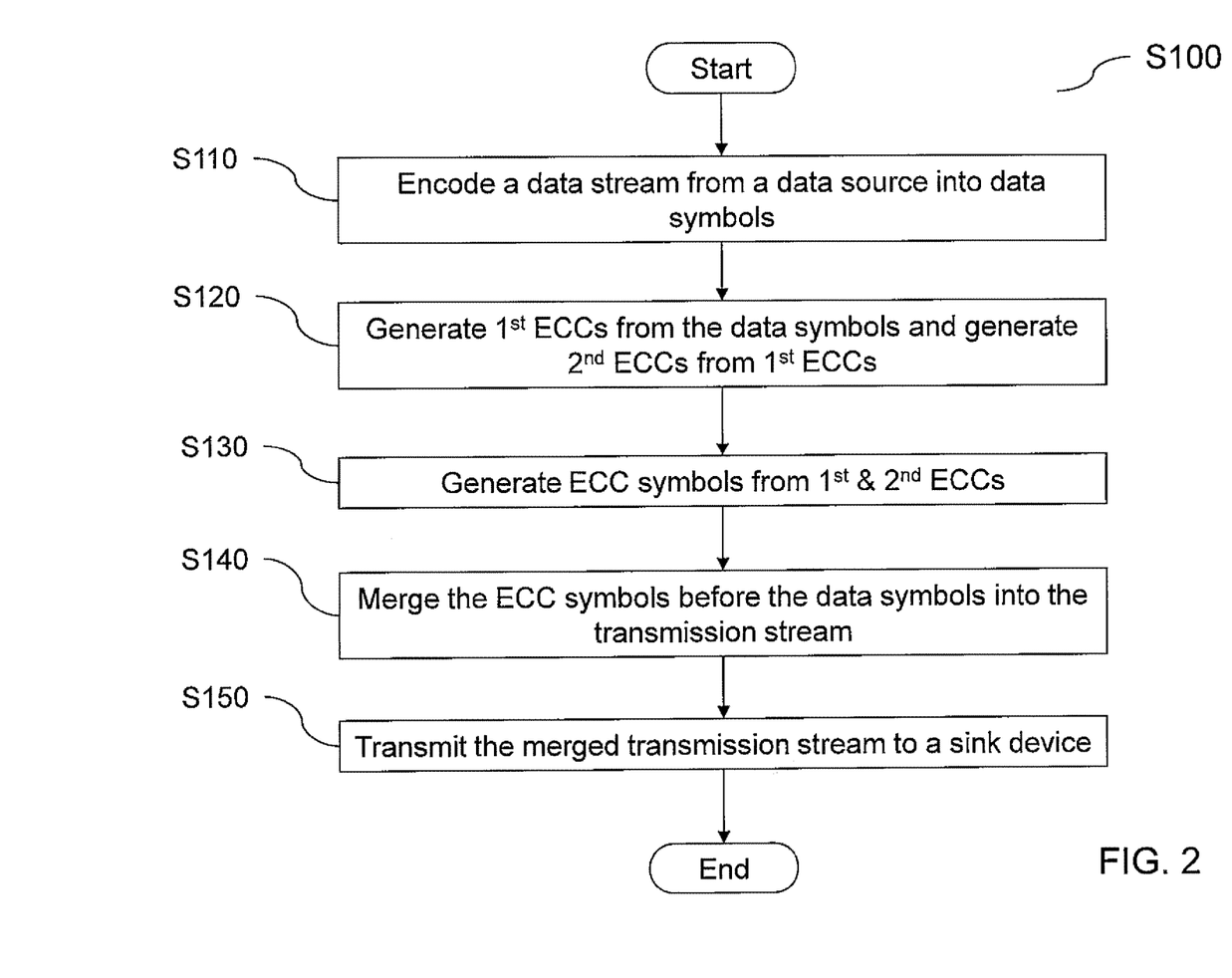
FIG. 2 is a flow diagram of a method of transmitting ECC codes in a symbol encoded transmission stream according to some exemplary embodiments of the present invention.

FIG. 2 is a flow diagram S100 of a method of transmitting ECC codes in a symbol encoded transmission stream according to some exemplary embodiments of the present invention. This and other methods disclosed herein may be implemented, for example, as a series of computer instructions to be executed by a processor (or other computing device), such as a microprocessor, or two or more processors. The processor(s) may execute computer program instructions and interact with other system components for performing the various functionalities described herein. The computer program instructions may be stored in a memory implemented using a standard memory device, such as, for example, a random access memory (RAM). The computer program instructions may also be stored in other non-transitory computer readable media such as, for example, a CD-ROM, flash drive, or the like. The methods may also be implemented using hardware circuits (e.g., transistors, capacitors, logic gates, field programmable gate arrays (FPGAs), etc.), or combinations of hardware circuits, software, and firmware, as would be apparent to one of ordinary skill.

Figure 3:
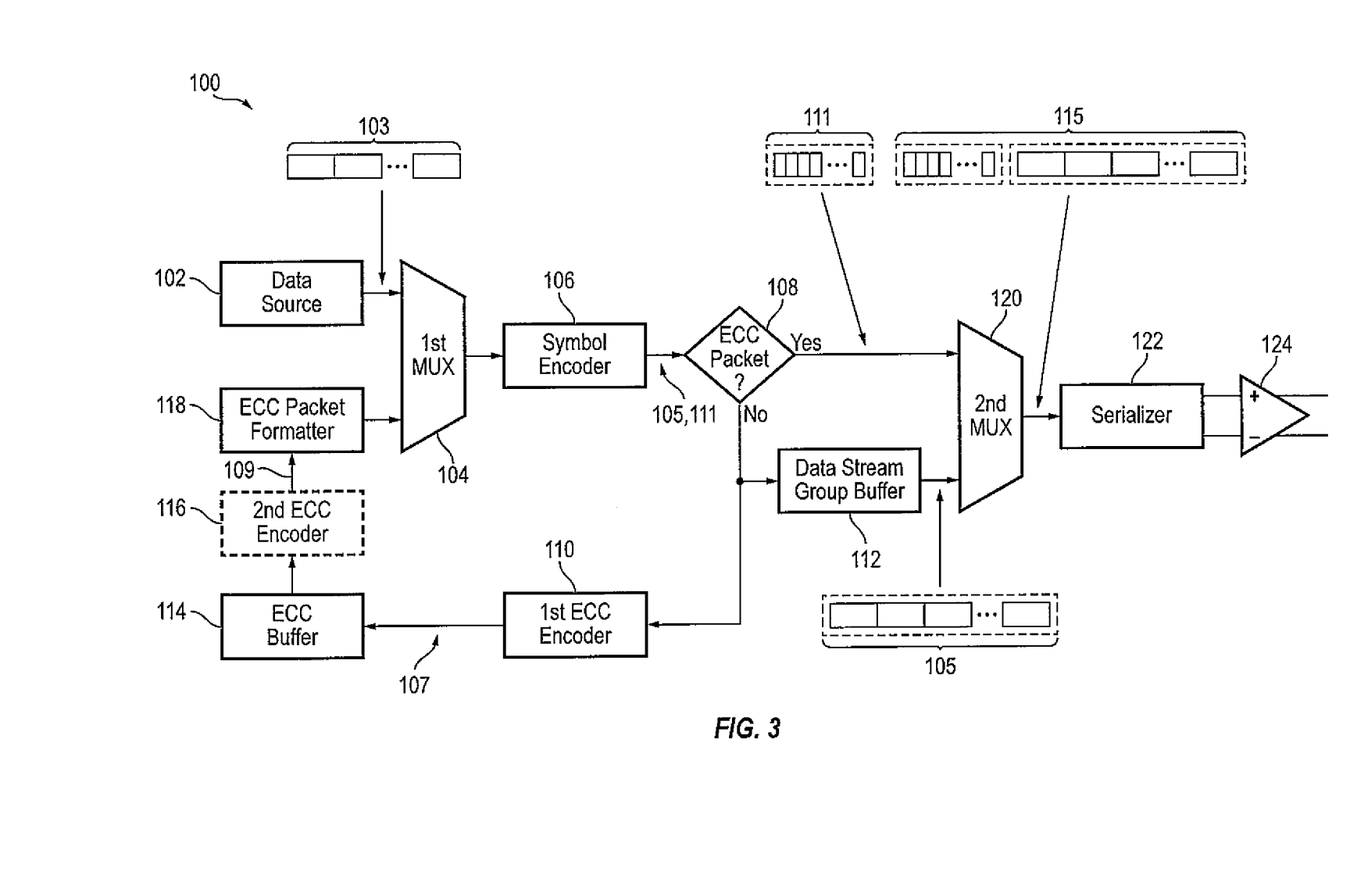
FIG. 3 is a block diagram of a transmission stream encoder according to some exemplary embodiments of the present invention, such as the embodiments of FIG. 2.

FIG. 3 is a block diagram of a source device (e.g., a transmission stream encoder) 100 according to some exemplary embodiments of the present invention, such as the embodiments of FIG. 2. This and other logic circuits disclosed herein, such as those of FIGS. 5, 7, and 9, may be implemented, for example, as a layout of hardware circuits (e.g., AND/OR gates, multiplexers, amplifiers, etc.), FPGAs, firmware, or software executed by an appropriate processor, such as a microprocessor, or any suitable combination of hardware, software (e.g., computer instructions stored in memory and executed on a computer or microprocessor), and firmware as would be known to those skilled in the art.

Referring to FIGS. 2-3, processing begins, and in act S110, a data stream 103 supplied by a data source 102 is received by a first multiplexer 104 and forwarded to a symbol encoder 106. The symbol encoder 106 then encodes the data stream 103 into symbols (e.g., data symbols) 105. The data stream 103 may include, for example, 8-bit bytes of data to be transmitted from the data source 102, such as a video source device, to a receiving (or sink) device 200, such as a display device.

In some examples, the data bytes may represent image data to be displayed on a display panel of the display device. This data symbol encoding may be performed on sets (or packets) of data bytes (e.g., 8 or 64 bytes in each packet) at a time from the data stream 103. Each packet of data bytes from the data stream 103 is encoded into a corresponding packet of data symbols 105 that is later added to a transmission stream 115.

In some examples, symbol encoder 106 may be an 8/10 encoder (8-bit bytes as input, 10-bit symbols as output) and generate data symbols 105 that are 10-bit symbols, such that each byte of the data stream 103 is represented by one of the data symbols 105. Such encoding may be desirable, for example, for creating DC-balanced streams (having substantially the same number of 0-bits as 1-bits), for performing clock recovery or phase recovery, and for guaranteeing sufficiently dense transitions (e.g., 0-bit to 1-bit transitions or vice versa) in a serial bit stream.

These data byte/symbol sizes, packet sizes, and encoding/decoding techniques, however, are merely examples, and the present invention is not limited thereto. For ease of description, though, an 8-bit data byte, 10-bit symbol, and standard 8/10 encoding and 10/8 decoding will be assumed throughout, with different data byte/symbol sizes and their corresponding encoding/decoding algorithms being part of similar embodiments of the present invention as would be apparent to one of ordinary skill. In addition to the data stream 103, the first multiplexer 104 may receive other input data, including auxiliary data (e.g., audio) and metadata that undergo encoding prior to transmitting. For further ease of description, auxiliary data will not be treated any differently than regular input data, and it will be assumed that the only metadata is the error correcting code bits, bytes, and symbols that will now be described.

In act S120, the first packet identifier 108 receives the symbols 105 from the output of the symbol encoder 106 and determines that the symbols 105 are data symbols. The first packet identifier 108 then forwards the data symbols to a data buffer (e.g., a data stream group buffer) 112 for temporary storage until after the processes performed in act S130 are complete. In some examples, the data buffer 112 may be a semiconductor memory including silicon-based transistors, and/or the like.

In act S120, after determining that the symbols 105 are data symbols, the first packet identifier 108 also forwards the symbols to an error correction code (ECC) encoder 110, which encodes the data symbols 105 into first error correcting codes (ECCs) 107 using a forward error correction (FEC) algorithm.

The first ECC 107 includes a set of redundancy (or parity) bits or bytes. For ease of description, ECCs (such as the first ECCs 107) may be described as bytes. In some examples, a hamming code (or any other suitable code known to one of ordinary skill) may be used to generate the redundancy (parity) bits (first ECC) 107 for the data symbols 105. The hamming code may have sufficient parity bits, for example, to detect multiple bit errors or to correct a single bit error in a set (e.g., a group or packet) of symbols in the transmission stream 115, or to detect multiple bit errors and to correct a single bit error in the set of symbols, or to correct multiple bit errors in the symbols.

The ECC encoder 110 may perform the first ECC processing on each packet of data symbols 105, creating a corresponding group of first ECC bytes 107 in the process. The ECC buffer 114 may buffer (e.g., store) the groups of first ECC bytes 107 until a sufficient number of data packets (e.g., a number of data packets that improves efficiency of the ECC generation) have been encoded.

In some embodiments, the first ECCs 107 may be passed to the symbol encoder 106 (in act S130) without further processing (e.g., without performing a further ECC process on the first ECCs 107). In other embodiments, the first ECCs 107 may be further treated like data and processed by a second ECC encoder 116 to generate second ECCs 109, which in turn is assembled into bytes and later encoded into symbols 111 by the symbol encoder 106. Performing a second ECC process protects simple transmission errors in the ECC symbols from compounding into multiple errors (e.g., protects bit errors from turning into byte errors).

In some examples, the second ECCs 109 may be generated by feeding the first ECCs 107 back into the first ECC encoder 110. That is, the second ECC encoder 116 may be the same as the first ECC encoder 110. This process may further be extended to higher levels (i.e., more passes through the first ECC encoder 110 or further ECC encoders), as would be apparent to one of ordinary skill.

In other examples, the second (e.g., higher complexity) ECC encoder 116 may apply an FEC algorithm having a higher complexity than that of the first ECC encoder 110. For example, the second ECC encoder may apply byte-level ECC encoding, such as reed-solomon or low-density parity-check (LDPC).

Further, in act S120, the ECC packet formatter 118 assembles the ECCs (i.e., the buffered first ECCs 107 or the second ECCs 109) into groups of bytes (e.g., in metadata packets) and forwards the packets to the first multiplexer 104.

In act S130, the symbol encoder 106 receives the assembled ECCs (i.e., the assembled first ECCs 107 or the second ECCs 109) from the first multiplexer 104 and encodes them into ECC symbols (e.g., parity symbols) 111 to later accompany the data symbols 105 in the transmission stream 115 using the same encoding scheme as the data symbols 105. The first packet identifier 108 then determines the ECC symbols 111 to be ECC packets and forwards them to the second multiplexer (combiner or merger) 120 for merging with the buffered data symbols 105 (act S140).

In act S140, the second multiplexer 120 merges the ECC symbols 111 with the buffered data symbols 105 to form the transmission stream 115. According to some embodiments, the second multiplexer 120 places the ECC symbols 111 ahead of the buffered data symbols 105 in time, so that the ECC symbols 111 are transmitted before the buffered data symbols 105.

Accordingly, the groups of ECC (parity) symbols 111 are carried in the same transmission stream 115 as their corresponding packets of data symbols 105. The two types of symbols may be distinguishable based on, for example, location in the symbol stream, or metadata identifiers, and/or the like. In some examples, the second multiplexer 120 may further frame the ECC symbols with control codes.

In act S150, the serializer 122 serializes the transmission stream 115 and the transmitter 124 transmits the serialized transmission stream to the receiving device 200. In some examples, the transmission stream 115 may be sent one bit at a time at a set or predetermined transmission rate (e.g., a high-speed serial link) to the receiving device 200. In some embodiments, the packets of ECC symbols 111 may be sent first followed by their corresponding groups of data symbols 105. Control symbols may be used, for example, to separate the packets of data symbols 105 from the groups of ECC symbols 111. In some examples, the transmitter 124 may be a digital/analog circuit (having a single-ended or differential output) for converting digital bits to an electronic signal (e.g., a differential signal) for transmission through the communication link 300.

Figure 4:
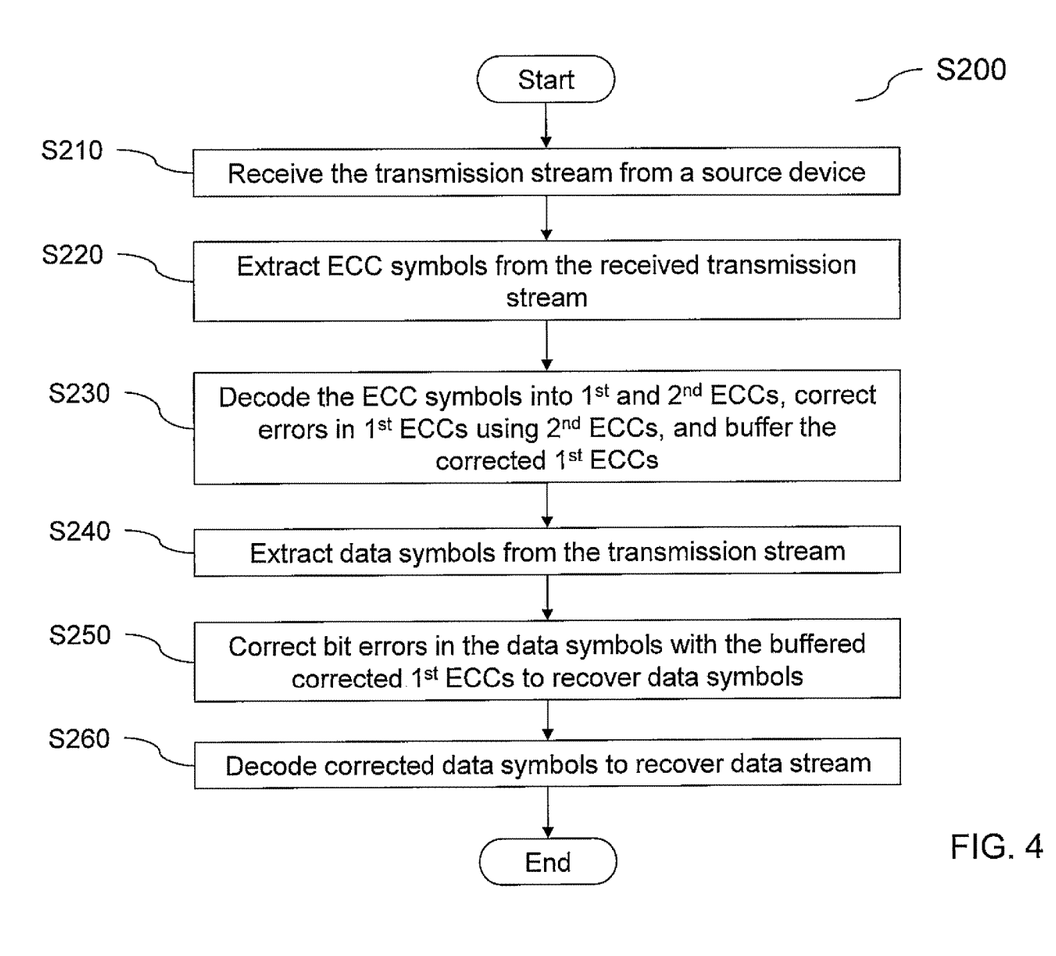
FIG. 4 is a flow diagram of a method of receiving ECC codes in a symbol encoded transmission stream according to some exemplary embodiments of the present invention.
Figure 5:
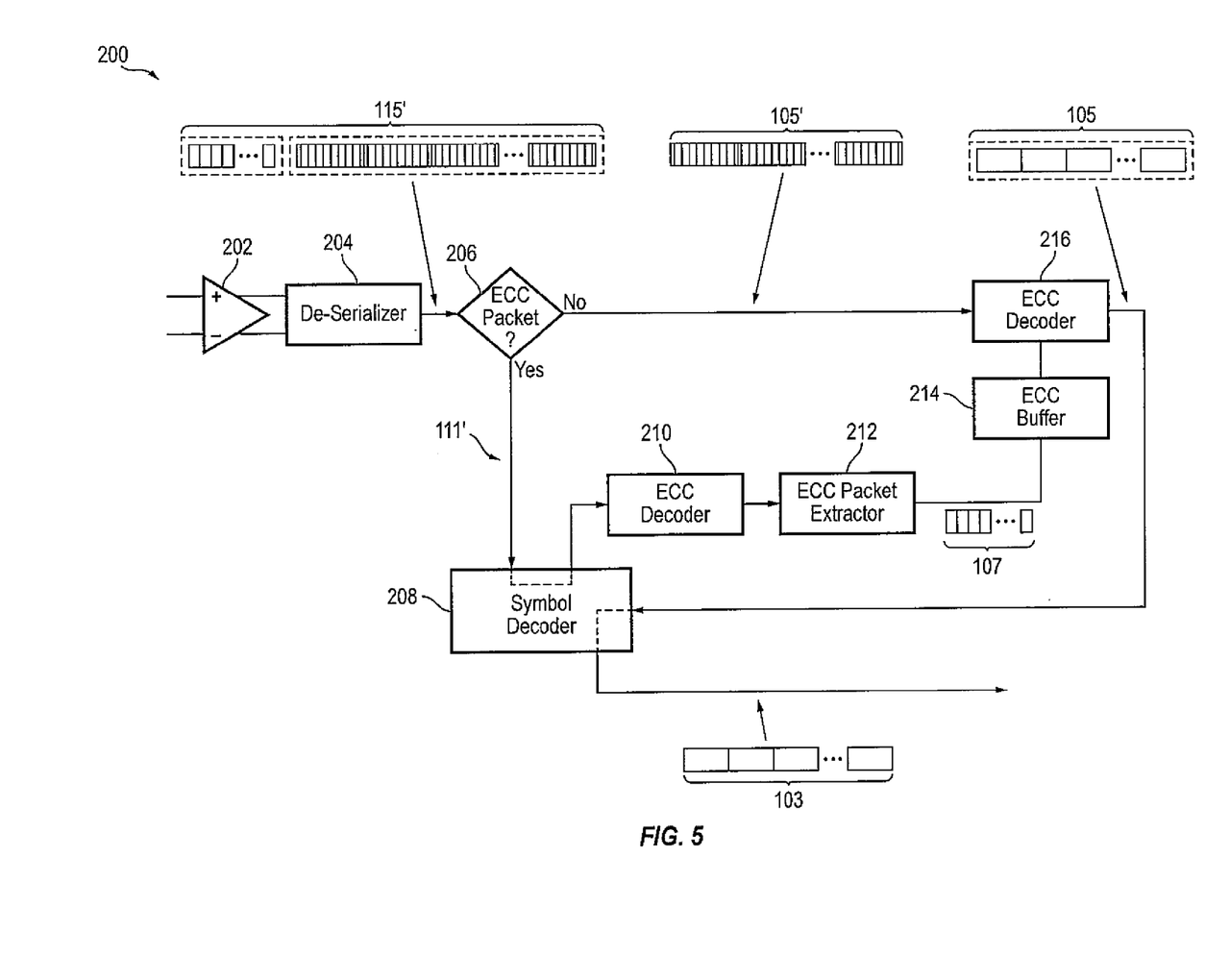
FIG. 5 is a block diagram of a transmission stream decoder according to some exemplary embodiments of the present invention, such as the embodiments of FIG. 4.

FIG. 4 is a flow diagram S200 of a method of receiving ECC codes in a symbol encoded transmission stream according to some exemplary embodiments of the present invention. FIG. 5 is a block diagram of a source device (e.g., a transmission stream decoder) 200 according to some exemplary embodiments of the present invention, such as the embodiments of FIG. 4.

In act S210, the receiver 202 receives the transmission stream 115' from the source device, in which the ECC symbols are sent (and received) before the corresponding symbols. The de-serializer 204 then de-serializes the received transmission stream 115' into the (unextracted) data symbols and ECC symbols that make up the transmission stream 115'. In some examples, the receiver 202 may be a digital/analog circuit (having a single or differential input) for converting an electronic signal (e.g., a differential signal) transmitted through the communication link 300 to digital bits.

In act S220, the second packet identifier 206 identifies and extracts (e.g., separates or isolates) the ECC symbols 111' from the received transmission stream 115' and forwards the identified ECC symbols 111' to the symbol decoder 208. Similar to the source device 100, the ECC symbols 111' may be identified based on, for example, location in the symbol stream, or metadata identifiers, control codes, and/or the like. Thus, the extraction process is effectively the reverse of the stream assembling process at the source device 100.

In act S230, the symbol decoder 208 decodes the identified ECC symbols 111' using an algorithm corresponding to the encoding algorithm employed by the symbol encoder 106 (e.g., a 10/8 decoding algorithm) to produce the corresponding ECC (parity) bytes (such as the first ECC and second ECC as described above). In addition, depending on the second ECC technique, if any, used (e.g., by the second ECC encoder 116) to protect the first ECC bytes 107 in the source device 100, the corresponding error correction may be performed on the decoded ECC bytes by an ECC decoder 210 to produce the corrected first ECCs. For example, if reed-solomon is used to protect the first ECC bytes 107, then the ECC decoder 210 may use a reed-solomon error correcting logic (e.g., the decoded second ECC may be used to correct errors in the decoded first ECC).

In act S230, the ECC packet extractor 212 extracts the first ECCs 107 from the metadata packets in the corrected first ECCs and forwards the extracted first ECCs 107 to the ECC buffer 214 for temporary storage until the data symbols of the incoming transmission stream 115' are received and extracted. In some examples, the ECC buffer 214 may be a semiconductor memory including silicon-based transistors, and/or the like.

In act S240, the second packet identifier 206 identifies and extracts (e.g., separates or isolates) the data symbols 105' from the received transmission stream 115' and forwards the identified data symbols 105' to the first ECC decoder 216.

In act 250, the first ECC decoder 216 employs a decoding algorithm to correct bit errors in the extracted data symbols 105' based on the buffered (and corrected) first ECCs. The decoding algorithm may correspond to the encoding algorithm employed by the first ECC encoder 110 (e.g., a hamming algorithm) to produce the corresponding data bytes. Extraction of the ECCs ahead of the data symbols of the transmission stream 115' eliminates the need to buffer the data symbols prior to decoding, which reduces memory requirements at the receiver device 200 and allows for a more efficient receiver-side implementation (as memory may be implemented less efficiently (e.g., is more costly) at the receiver 200 than at the sink device 100).

In act S260, the corrected data symbols 105' are transmitted to the symbol decoder 208 (or to a different symbol decoder) to recover the data stream 103 from the corrected data symbols 105'. The decoding algorithm employed by the symbol decoder 208 corresponds to the encoding algorithm used by the symbol encoder 106 (e.g., a 10/8 decoding algorithm) to produce the corresponding data stream 103.

As mentioned above, in some embodiments, the ECC is carried in the transmission stream as symbols similar to the data symbols, with the ECC being embedded in stream metadata packets and sent through the transmission encoding function (e.g., the same transmission encoding function used to generate the data symbols) to preserve consistent encoding and decoding throughout the whole transmission stream.

Figure 6:
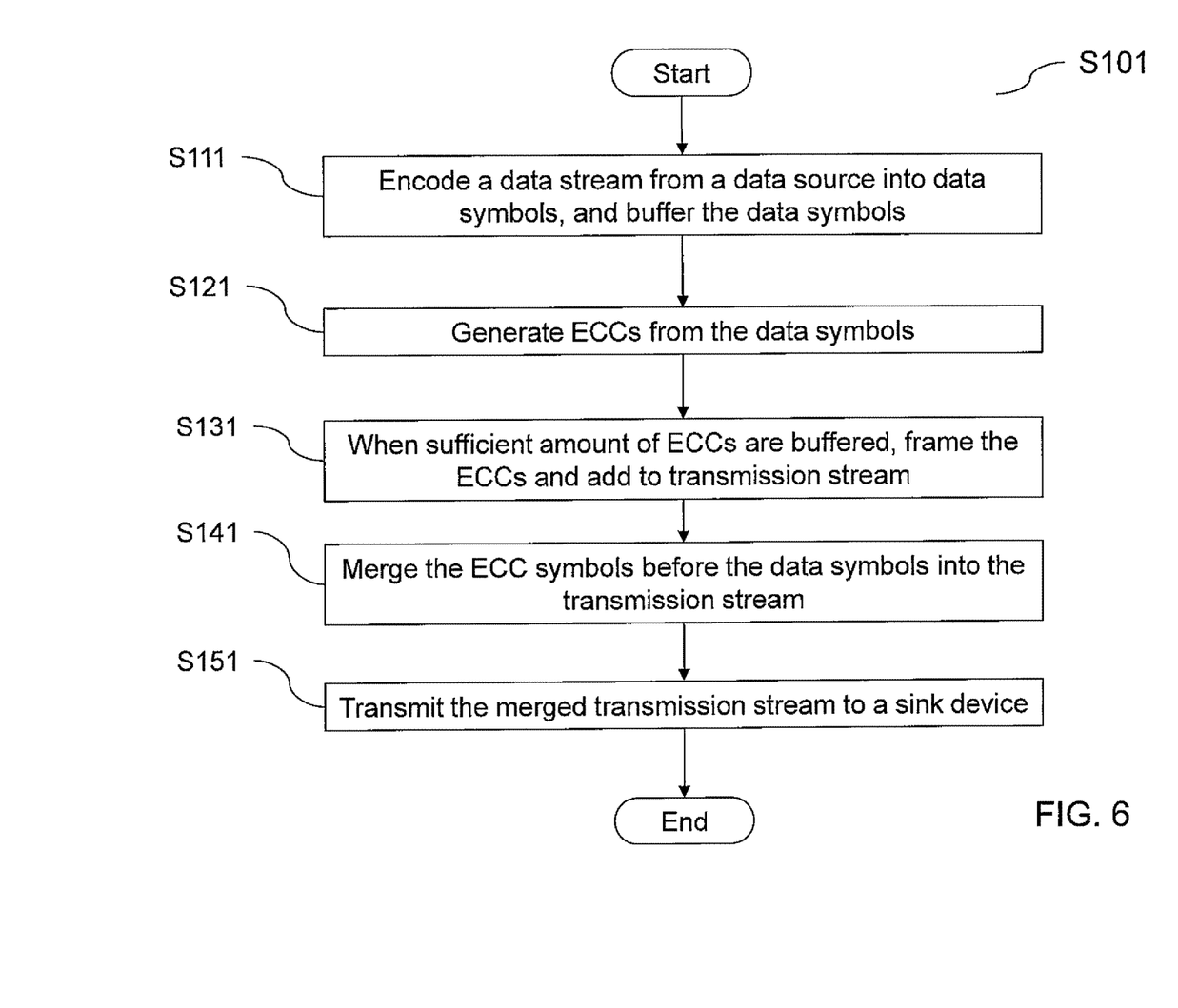
FIG. 6 is a flow diagram of a method of transmitting ECCs in a symbol encoded transmission stream according to some exemplary embodiments of the present invention.
Figure 7:
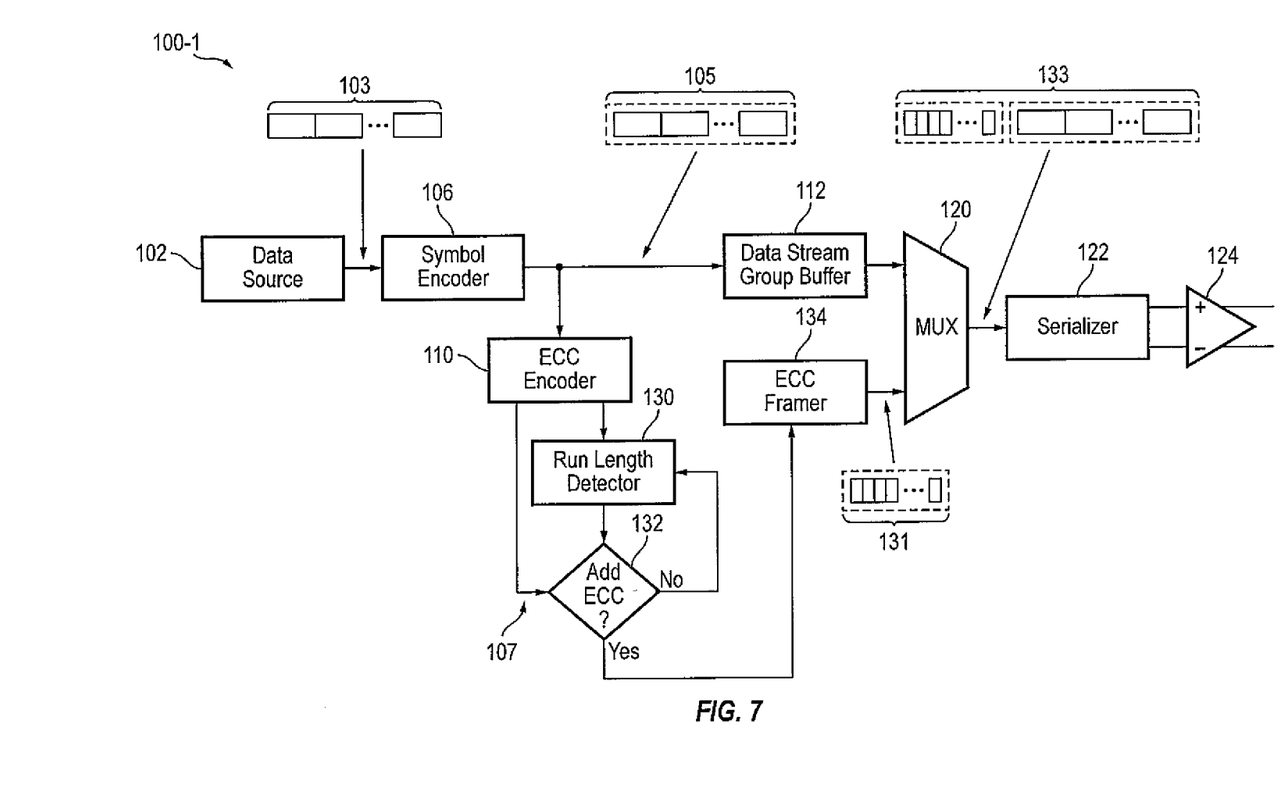
FIG. 7 is a block diagram of a transmission stream encoder according to some exemplary embodiments of the present invention, such as the embodiments of FIG. 6.

FIG. 6 is a flow diagram S101 of a method of transmitting ECCs in a symbol encoded transmission stream according to some exemplary embodiments of the present invention. FIG. 7 is a block diagram of a source device (e.g., a transmission stream encoder) 100-1 according to some exemplary embodiments of the present invention, such as the embodiments of FIG. 6. Portions of the embodiment(s) of FIG. 6 and FIG. 7 may be identical or similar to corresponding portions of the embodiment(s) of FIG. 2 and FIG. 3 described above. As such, descriptions of such portions may not be repeated.

Referring to FIG. 6 and FIG. 7, processing begins, and in act S111, a data source 102 supplies a data stream 103 to a symbol encoder 106 to be encoded into data symbols 105. In some examples, packets of data bytes from the data stream 103 may be encoded into corresponding packets of data symbols 105 using an 8/10 encoder as the symbol encoder 106. The symbol encoder 106 transmits the data symbols 105 to a data buffer (e.g., a data stream group buffer) 112 for temporary storage until after the processes performed in act S131 are complete.

In act S121, an ECC encoder 110 encodes the data symbols 105 to create ECCs 107 (e.g., parity bits or bytes)

for the data symbols 105. In some examples, a hamming code algorithm may be used to generate the ECCs 107 for the data symbols 105. Each packet of data symbols 105 may be used to generate a corresponding group of ECCs 107. The hamming code may have sufficient parity bits, for example, to detect multiple bit errors or to correct a single bit error in a set of symbols and ECCs in the transmission stream 133, or to detect multiple bit errors and to correct a single bit error in the set of symbols and ECCs, or to correct multiple bit errors in the symbols and ECCs.

In act S131, a run length detector 130 buffers and assesses the generated ECCs 107. To avoid, for example, some of the intricacies of encoding the ECC bytes (as described above with reference to, e.g., FIGS. 2-3), in the embodiments of FIGS. 6-7, the ECCs 107 may be added to the transmission stream 133 without undergoing encoding. This helps prevent, for example, single bit errors in the transmission stream from producing multiple bit errors in the received ECC bytes. However, without encoding, the ECCs 107 may not be in the proper form to satisfy transport protocols of the transmission stream 133 (e.g., the ECCs 107 may fail rules or guidelines related to DC balancing, or having a sufficient number of transitions between 0- and 1-bits or vice versa).

Accordingly, the run length detector 130 and the decision block 132 may gauge the generated ECCs 107, and if the ECCs 107 have reached some set or predetermined criteria, the run length detector 130 may stop further buffering the ECCs 107, and instead may transfer the generated ECCs 107 to the second multiplexer 120. The set or predetermined criteria may include reaching a certain length, not being in sufficient DC balance, or not having enough transitions to warrant further growth (i.e., the number of transitions in the ECCs being below a preset value). In some examples, the aforementioned criteria may be set according to a communication standard, such as USB 3.1 or the like. In some examples, the framer 134 may frame the ECCs 107 with control symbols to produce framed ECCs 131, which are later inserted by the multiplexer 120 into the transmission stream 133 before its corresponding data packets (act S141).

In act S141, the second multiplexer 120 merges the buffered data symbols 105 and the framed ECCs 131 into the transmission stream 133, which is serialized by the serializer 122 and is transmitted to a receiving (or a sink device) 200-1, in act S151, by the transmitter 124. For example, the transmission stream 133 may be sent one bit at a time at a set or predetermined transmission rate (e.g., via a high-speed serial link) to a receiving device 200-1 after having gone through the serializer 122. In some embodiments, the frame ECCs 131 may be sent before the packets of corresponding data symbols.

Figure 8:
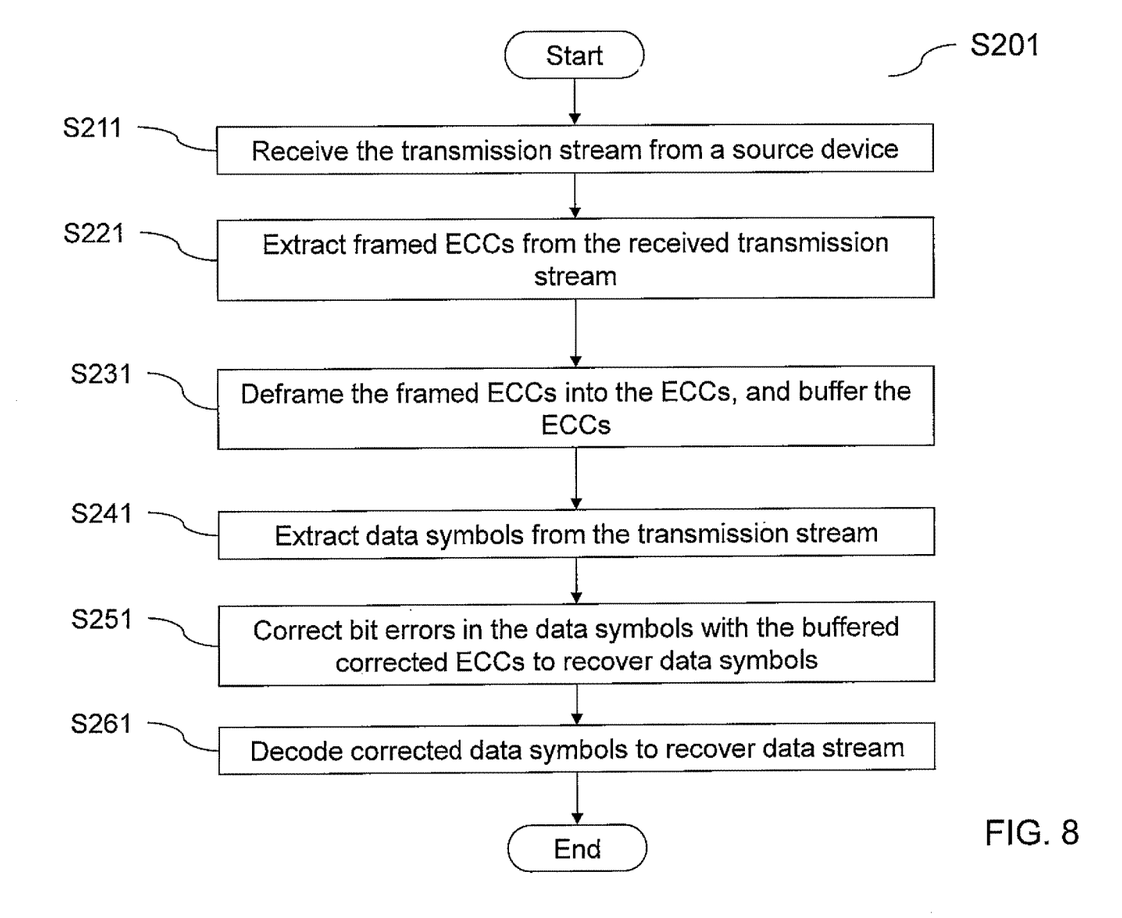
FIG. 8 is a flow diagram of a method of receiving ECCs in a symbol encoded transmission stream according to some exemplary embodiments of the present invention.
Figure 9:
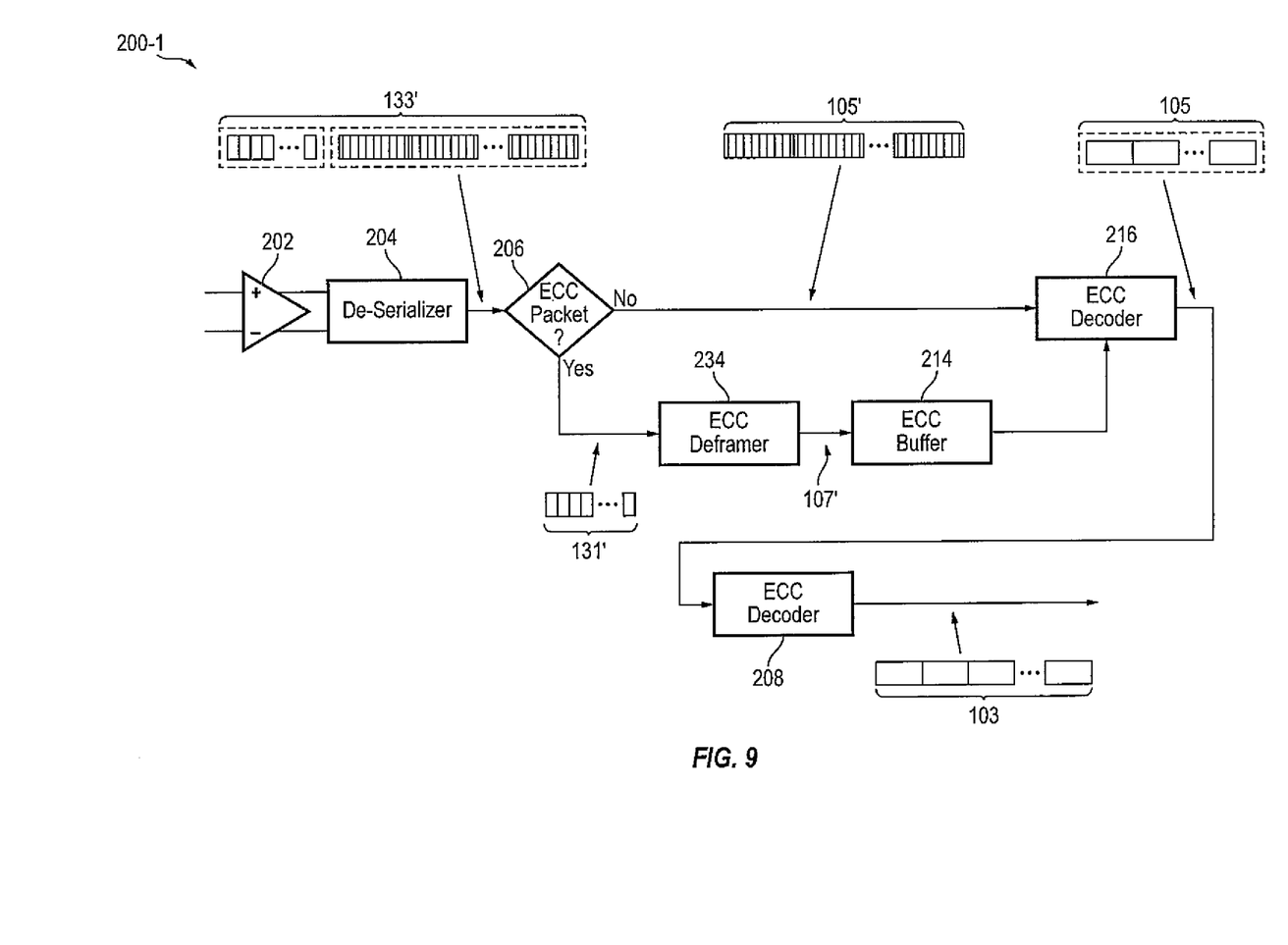
FIG. 9 is a block diagram of a transmission stream decoder according to some exemplary embodiments of the present invention, such as the embodiments of FIG. 8.

FIG. 8 is a flow diagram S201 of a method of receiving ECCs in a symbol encoded transmission stream according to some exemplary embodiments of the present invention. FIG. 9 is a block diagram of a receiving device (e.g. a transmission stream decoder) 200-1 according to some exemplary embodiments of the present invention, such as the embodiments of FIG. 8. Portions of the embodiment(s) of FIG. 8 and FIG. 9 may be identical or similar to corresponding portions of the embodiment(s) of FIG. 4 and FIG. 5 described above. As such, descriptions of such portions may not be repeated.

In act S211, the receiver 202 receives the transmission stream 133' from the source device 100-1 via the communication link 300, and the de-serializer 204 de-serializes the received transmission stream 133' into the (unextracted) data symbols and ECC bytes that make up the transmission stream 133 sent to the receiving device 200-1.

In act S221, the packet identifier 206 identifies and extracts the framed ECCs 131' from the received transmission stream 133' and transmits the extracted framed ECCs 131' to the de-framer 234 for frame removal. Depending on how the ECCs 107 are framed by the run length detector 130 and inserted as the framed ECCs 131 into the transmission stream 133 (e.g., the control symbols used to identify or frame the ECC bytes), the de-framing of the framed ECCs 131', in act S231, reverses this process to separate the ECCs 107' from the data symbols 105' representing the data stream. The ECCs 107' are then buffered in the ECC buffer 214.

In act S241, the packet identifier 206 identifies the received data symbols 105' of the transmission stream 133' and forwards them to the first ECC decoder 216 for byte correction.

In act S251, the first ECC decoder 216 recovers the corrected data symbols 105 that make up the data stream using the buffered ECCs 107'. The first ECC decoder 216 may employ a decoding algorithm corresponding to (e.g., the reverse of) the FEC algorithm (e.g., a hamming code) used to generate the ECCs 107 in the source device 100-1. The same processing may also be used to concurrently correct bit errors in the transmitted ECC bytes. For example, a hamming code can detect and correct (transmission) errors in the data symbols 105' and their corresponding (unencoded) ECC bytes 107' as part of the same ECC processing.

In act S261, the recovered (corrected) data symbols 105 are decoded by a symbol decoder 208 that reverses the encoding performed by the symbol encoder 110, to recover the data stream 103, which may then be supplied to the data sink (e.g., a sink device such as a display device). For example, if the 8/10 encoder is used as the symbol encoder 110 to encode the data stream 103 into data symbols 105, then the 10/8 decoder may be used to decode the recovered (corrected) data symbols 105 in the received transmission stream.

According to embodiments of the present invention, by transmitting the ECCs before the encoded transmission stream, while performing error correction, the buffer at the receiver may only store the ECCs, and not the transmission stream. This reduces the size of the buffer memory at the receiver and, as a result, reduces the size and complexity of the receiver, and the overall system cost.

It will be understood that, although the terms "first", "second", "third", etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include", "including", "comprises", and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or"

includes any and all combinations of one or more of the associated listed items. Expressions such as "at least one of", when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on", "directly connected to", "directly coupled to", or "immediately adjacent" another element or layer, there are no intervening elements or layers present.

As used herein, the terms "substantially", "about", and similar terms are used as terms of approximation and not as terms of degree, and are intended to account for the inherent variations in measured or calculated values that would be recognized by those of ordinary skill in the art.

As used herein, the terms "use", "using", and "used" may be considered synonymous with the terms "utilize", "utilizing", and "utilized", respectively.

While the present invention has been described in connection with certain example embodiments, it is to be understood that the invention is not limited to the disclosed embodiments, but, on the contrary, is intended to cover various modifications and equivalent arrangements included within the spirit and scope of the appended claims, and equivalents thereof

What is claimed is:

1. A method of transporting error correction codes (ECCs) in a transmission stream and reduce a buffer size at a receiver, the method being implemented using a transmission stream encoder comprising a processor, the method comprising:
    encoding, by the processor, a data stream from a data source into data symbols using a symbol encoder;
    buffering, by the processor, the data symbol in a data stream buffer;
    generating, by the processor, first ECCs from the data symbols;
    encoding, by the processor, the first ECCs into first error correction code (ECC) symbols using the symbol encoder;
    generating, by the processor, second ECCs from the first ECCs; and
    encoding, by the processor, the second ECCs into second ECC symbols using the symbol encoder;
    merging, by the processor, the data symbols stored in the data stream buffer and the first ECC symbols and the second ECC symbols into the transmission stream, the first and second ECC symbols being merged before the data symbols into the transmission stream; and
    transmitting, by the processor, the merged transmission stream to a sink device via a communication link, the first ECC symbols being transmitted before the data symbols.

2. The method of claim 1, wherein the encoding of the data stream into the data symbols and the encoding of the first ECCs into the first ECC symbols comprise a same encoding technique.

3. The method of claim 1, wherein the encoding the first ECCs comprises inserting, by the processor, a first control symbol before the first ECC symbols and inserting a second control symbol between the first ECC symbols and the data symbols into the transmission stream.

4. The method of claim 1, wherein the transmitting of the merged transmission stream comprises:
    serializing, by the processor, the merged transmission stream; and
    transmitting, by the processor, the serialized transmission stream over a serial data link to the sink device.

5. A method for extracting a data stream from a transmission stream comprising transport error correction codes (ECCs), the method being implemented using a transmission stream decoder of a sink device, the transmission stream decoder comprising a processor, the method comprising:
    receiving, by the processor, the transmission stream from a source device via a communication link;
    extracting, by the processor, error correction code (ECC) symbols from the received transmission stream, wherein the ECC symbols are received before data symbols in the transmission stream;
    decoding, by the processor, the ECC symbols into first ECCs using a symbol decoder, wherein the decoding the first ECC symbols comprises:
        decoding, by the processor, the ECC symbols into second ECCs using the symbol decoder; and
        correcting, by the processor, errors in the first ECCs with the second ECCs;
    buffering, by the processor, the corrected first ECCs;
    extracting, by the processor, the data symbols from the transmission stream;
    correcting, by the processor, errors in the data symbols with the buffered corrected first ECCs; and
    decoding, by the processor, the corrected data symbols into a data stream for outputting by the sink device using the symbol decoder.

6. The method of claim 5, wherein the decoding of the first ECC symbols into the first ECCs and the decoding of the corrected data symbols into the data stream comprise a same decoding technique.

7. The method of claim 5, wherein the extracting of the ECC symbols comprises identifying, by the processor, a control symbol between first ECC symbols and the data symbols and from the transmission stream.

8. The method of claim 5, wherein the receiving of the transmission stream comprises:
    receiving, by the processor, the transmission stream from the source device over a serial data link; and
    de-serializing, by the processor, the received transmission stream.

9. A method of transporting error correction codes (ECCs) in a transmission stream, the method being implemented using a transmission stream encoder comprising a first processor and a transmission stream decoder comprising a second processor, the method comprising:
    encoding, by the first processor of a source device, a data stream from a data source into first data symbols using a symbol encoder;
    buffering, by the first processor, the first data symbols in a data stream buffer;
    generating, by the first processor, first ECCs from the first data symbols;
    generating, by the first processor, second ECCs from the first ECCs; and
    encoding, by the first processor, the first ECCs and second ECCs into first and second ECC symbols respectively using the symbol encoder;

buffering, by the first processor, the first and second ECC symbols at the source device until a criteria has been met;

merging, by the first processor, the first data symbols stored in the data stream buffer and the buffered ECC symbols into the transmission stream, the buffered ECC symbols being merged before the first data symbols into the transmission stream;

transmitting, by the first processor, the merged transmission stream to a sink device via a communication link, the buffered ECC symbols being transmitted before the first data symbols;

receiving, by the second processor of the sink device, a received transmission stream from the source device;

extracting, by the second processor, the ECC symbols from the received transmission stream;

decoding, by the second processor, the ECC symbols into first ECCs using a symbol decoder, wherein the decoding the ECC symbols comprises:
  decoding, by the second processor, the ECC symbols into second ECCs using the symbol decoder; and
  correcting, by the second processor, errors in the first ECCs with the second ECCs;

buffering, by the second processor, the corrected first ECCs at the sink device;

extracting, by the second processor, second data symbols from the received transmission stream;

correcting, by the second processor, errors in the second data symbols with the buffered corrected first ECCs at the sink device; and decoding, by the second processor, the corrected second data symbols into a corrected data stream for outputting by the sink device using the symbol decoder.

10. The method of claim 9, wherein the merging of the first data symbols and the buffered ECC symbols comprises:
  framing, by the first processor, the buffered ECC symbols at the source device with control symbols; and
  merging, by the first processor, the first data symbols and the framed ECC symbols into the transmission stream.

11. The method of claim 10, wherein framing the buffered ECC symbols comprises inserting, by the first processor, a first control symbol of the control symbols before the buffered ECCs and a second control symbol of the control symbols after the buffered ECCs into the transmission stream.

12. The method of claim 9, wherein the transmitting of the merged transmission stream comprises:
  serializing, by the first processor, the merged transmission stream; and
  transmitting, by the first processor, the serialized transmission stream over a serial data link to the sink device.

13. The method of claim 9, wherein the criteria comprises one or more of the first and second ECC symbols reaching a preset length, the first and second ECC symbols not being in sufficient DC balance, and a number of transitions in the first and second ECC symbols being below a preset value.

14. The method of claim 9, wherein extracting the ECC symbols from the received transmission stream comprises:
  extracting, by the second processor, framed ECCs from the received transmission stream; and
  deframing, by the second processor, the framed ECCs into the ECCs by identifying and removing a first control symbol before the framed ECCs and a second control symbol after the framed ECCs.

15. A method of transporting error correction codes (ECCs) in a transmission stream and reduce a buffer size at a receiver, the method being implemented using a transmission stream encoder, the method comprising:
  encoding, by a symbol encoder of the transmission stream encoder, a data stream from a data source into data symbols;
  generating, by an error correction code (ECC) encoder of the transmission stream encoder, first ECCs from the data symbols;
  buffering, by the processor, the data symbol in a data stream buffer;
  encoding, by the symbol encoder of the transmission stream encoder, the first ECCs into first error correction code (ECC) symbols;
  generating, by the processor, second ECCs from the first ECCs; and
  encoding, by the symbol encoder, the second ECCs into second ECC symbols;
  merging, by a multiplexer of the transmission stream encoder, the data symbols and the first ECC symbols and the second ECC symbols into the transmission stream, the first and second ECC symbols being merged before the data symbols into the transmission stream; and
  transmitting, by a transmitter of the transmission stream encoder, the merged transmission stream to a sink device via a communication link, the first and second ECC symbols being transmitted before the data symbols.

16. A method for extracting a data stream from a transmission stream comprising transport error correction codes (ECCs), the method being implemented using a transmission stream decoder, the method comprising:
  receiving, by a receiver of the transmission stream decoder, the transmission stream from a source device via a communication link;
  extracting, by a processor of the transmission stream decoder, error correction code (ECC) symbols from the received transmission stream, wherein the ECC symbols are received before data symbols in the transmission stream;
  decoding, by a symbol decoder of the transmission stream decoder, the ECC symbols into first ECCs, wherein the decoding the first ECC symbols comprises:
    decoding, by the symbol decoder, the ECC symbols into second ECCs; and
    correcting, by the processor, errors in the first ECCs with the second ECCs;
  buffering, by a buffer memory of the transmission stream decoder, the corrected first ECCs;
  extracting, by the processor of the transmission stream decoder, the data symbols from the transmission stream;
  correcting, by an ECC decoder of the transmission stream decoder, errors in the data symbols with the buffered corrected first ECCs; and
  decoding, by the symbol decoder of the transmission stream decoder, the corrected data symbols into a data stream for outputting by a sink device.

* * * * *